US010706772B2

(12) United States Patent
Chu

(10) Patent No.: US 10,706,772 B2
(45) Date of Patent: Jul. 7, 2020

(54) TOUCH SUBSTRATE, MANUFACTURING METHOD THEREFOR, AND TOUCH DEVICE

(71) Applicant: BOE TECHNOLOGY GROUP CO., LTD., Beijing (CN)

(72) Inventor: Mingi Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/334,088

(22) PCT Filed: Jun. 27, 2018

(86) PCT No.: PCT/CN2018/093074
§ 371 (c)(1),
(2) Date: Mar. 18, 2019

(87) PCT Pub. No.: WO2019/037538
PCT Pub. Date: Feb. 28, 2019

(65) Prior Publication Data
US 2019/0237009 A1    Aug. 1, 2019

(30) Foreign Application Priority Data

Aug. 21, 2017    (CN) .......................... 2017 1 0718292

(51) Int. Cl.
*G09G 3/3225* (2016.01)
*H01L 27/32* (2006.01)
*G09G 3/3208* (2016.01)
(52) U.S. Cl.
CPC ......... *G09G 3/3225* (2013.01); *G09G 3/3208* (2013.01); *H01L 27/3213* (2013.01); *G09G 2320/0626* (2013.01)

(58) Field of Classification Search
CPC ... G09G 2300/0452; G09G 2320/0242; G09G 2320/0626; G09G 2360/145;
(Continued)

(56) References Cited

U.S. PATENT DOCUMENTS 9,196,193 B2    11/2015 Jang et al.
9,299,283 B2    3/2016 Chun et al.
(Continued)

FOREIGN PATENT DOCUMENTS

CN    103680413 A    3/2014
CN    104103236 A    10/2014
(Continued)

OTHER PUBLICATIONS

Search Report and Written Opinion for International Application No. PCT/CN2018/093074 dated Sep. 25, 2018.

*Primary Examiner* — Richard J Hong
(74) *Attorney, Agent, or Firm* — Calfee, Halter & Griswold LLP

(57) ABSTRACT

A color complementation method for a WOLED display device includes: determining at least two target output brightnesses; measuring and adjusting the WOLED display device by using the at least two target output brightnesses, respectively, to obtain data to be used; wherein the measuring and adjusting includes: allowing an output brightnesses of the WOLED display device to be same as each of the target output brightnesses, and adjusting output brightnesses of sub-pixels and obtaining the output brightnesses of the sub-pixels at a preset chromaticity coordinate as color complementation brightnesses of the sub-pixels; generating, according to the data to be used, correlations between the output brightnesses of the WOLED display device and the color complementation brightnesses of the sub-pixels;
(Continued)

according to the correlations, performing color complementation of the WOLED display device.

20 Claims, 2 Drawing Sheets

(58) Field of Classification Search
CPC .. G09G 3/2003; G09G 3/3208; G09G 3/3225; G09G 3/2081; G09G 3/3233; G09G 3/32; G09G 3/3607; G09G 3/3611; H01L 27/3213; H01L 27/3269; G06F 3/0416; G06F 3/0412; G06F 3/044; G01R 31/58; H04N 9/735
See application file for complete search history.

(56) References Cited

U.S. PATENT DOCUMENTS

| | | | |
|---|---|---|---|
| 9,870,728 B2 | 1/2018 | Tseng et al. | |
| 10,008,148 B2 | 6/2018 | Tseng et al. | |
| 2005/0206636 A1* | 9/2005 | Kanai | G09G 3/2081 |
| | | | 345/204 |
| 2012/0032995 A1* | 2/2012 | Lee | G09G 3/3233 |
| | | | 345/690 |
| 2014/0118411 A1 | 5/2014 | Jang et al. | |
| 2014/0204007 A1* | 7/2014 | Peana | G09G 3/3607 |
| | | | 345/88 |
| 2014/0306979 A1 | 10/2014 | Chun et al. | |
| 2015/0364081 A1 | 12/2015 | Tseng et al. | |
| 2016/0191881 A1* | 6/2016 | Sako | H04N 9/735 |
| | | | 348/224.1 |
| 2016/0253942 A1 | 9/2016 | Tseng et al. | |
| 2016/0307493 A1 | 10/2016 | Song et al. | |
| 2017/0140705 A1* | 5/2017 | Xu | G09G 3/2003 |
| 2018/0160091 A1 | 6/2018 | Chen | |
| 2019/0318686 A1* | 10/2019 | Chin | G09G 3/32 |
| 2020/0035172 A1* | 1/2020 | Chen | G09G 3/3611 |

FOREIGN PATENT DOCUMENTS

| | | |
|---|---|---|
| CN | 104269138 A | 1/2015 |
| CN | 104299568 A | 1/2015 |
| CN | 105096890 A | 11/2015 |
| CN | 106652962 A | 5/2017 |
| CN | 107316609 A | 11/2017 |
| EP | 3211631 A1 | 8/2017 |
| EP | 3211632 A1 | 8/2017 |

* cited by examiner

TOUCH SUBSTRATE, MANUFACTURING METHOD THEREFOR, AND TOUCH DEVICE

CROSS-REFERENCE TO RELATED APPLICATION

The present application is based upon International Application No. PCT/CN2018/093074, filed on Jun. 27, 2018, which claims priority to Chinese Patent Application No. 201710718292.6, filed on Aug. 21, 2017, the disclosure of which is incorporated herein by reference in its entirety as part of the present application.

TECHNICAL FIELD

The present disclosure relates to the field of display technologies, and more particularly, to a color complementation method for a WOLED display device, and a WOLED display device.

BACKGROUND

A WOLED display device includes pixel units including a red sub-pixel (R sub-pixel), a green sub-pixel (G sub-pixel), a blue sub-pixel (B sub-pixel), and a white sub-pixel (W sub-pixel). When in use, a white color may be displayed by combining light emitted from the above-descried sub-pixels. Generally, there may be a difference between the actual chromaticity coordinate of the white light emitted from the WOLED display device and the target chromaticity coordinate of the white light, so some of the R, B sub-pixels and the W sub-pixel must be used together by the WOLED display device to collectively display a white color so as to compensate for the chromaticity coordinate of the white color, i.e., to implement color complementation of the WOLED display device.

It shall be noted that the information disclosed in the BACKGROUND are only to strengthen the understanding of the background of the present disclosure, and the information therefore does not include any information that constitutes the prior art already known to those of ordinary skill in the art.

SUMMARY

The present disclosure provides a color complementation method for a WOLED display device, including:
determining at least two target output brightnesses;
measuring and adjusting the WOLED display device by using the at least two target output brightnesses, respectively, so as to obtain data to be used; wherein the measuring and adjusting includes: allowing an output brightness of the WOLED display device to be same as each of the target output brightnesses, and adjusting output brightnesses of R, B, and W sub-pixels in such a manner that an output chromaticity coordinate of the WOLED display device reach a preset chromaticity coordinate, and obtaining the output brightnesses of the R, B, and W sub-pixels at that time as color complementation brightnesses of the R, B, and W sub-pixels; and the data to be used comprises: the at least two target output brightnesses and the corresponding color complementation brightnesses of the R, B, and W sub-pixels;
obtaining, according to the data to be used, correlations between the output brightnesses of the WOLED display device and the color complementation brightnesses of the R, B, and W sub-pixels;
obtaining, according to the correlations, color complementation data for performing color complementation of the WOLED display device.

In some embodiments, the method further includes: performing color complementation of the WOLED display device by using the color complementation data.

In some embodiments, the method further includes:
obtaining calculated chromaticity coordinates of the R, B, and W sub-pixels under a determined output brightness of the WOLED display device;
calculating initial color complementation ratios of the R, B, and W sub-pixels based on the calculated chromaticity coordinates of the R, B, and W sub-pixels;
obtaining, according to the initial color complementation ratios of the R, B, and W sub-pixels, the color complementation data for performing color complementation of the WOLED display device.

In some embodiments, the performing color complementation of the WOLED display device according to the initial color complementation ratios of the R, B, and W sub-pixels includes:
determining a W output brightness of the display device, multiplying the W output brightness of the display device by the initial color complementation ratios of the R, B, and W sub-pixels to obtain initial color complementation brightnesses of the R, B, and W sub-pixels, and adjusting output brightnesses of the R, B, and W sub-pixels as the initial color complementation brightnesses of the R, B, and W sub-pixels.

In some embodiments, the obtaining, according to the correlations, color complementation data for performing color complementation of the WOLED display device includes:
determining the output brightness of the display device;
determining, according to the correlations, the color complementation brightnesses of the R, B, and W sub-pixels corresponding to the output brightness of the display device; adjusting the output brightnesses of the R, B, and W sub-pixels as the color complementation brightnesses of the R, B, and W sub-pixels.

In some embodiments, the determining at least two target output brightnesses includes:
continuously obtaining at least two brightness values as the target output brightnesses at a predetermined brightness interval.

In some embodiments, the predetermined brightness interval ranges from about 1 nit to about 20 nits.

In some embodiments, the predetermined brightness interval is about 10 nits.

In some embodiments, the determining at least two target output brightnesses includes:
determining 40 target output brightnesses.

In some embodiments, the method further includes:
continuously increasing the output brightness of the WOLED display device;
obtaining chromaticity coordinates of the R, B, and W sub-pixels; and
obtaining the calculated chromaticity coordinates of the R, B, and W sub-pixels, when the chromaticity coordinates of the R, B, and W sub-pixels remain substantially unchanged along with the increasing of the output brightness of the WOLED display device.

In another aspect, the present disclosure further provides a display device, in which the above-described color complementation method for the WOLED display device according to any one of the above described is applied; the WOLED display device includes: a color complementation circuit configured to obtain, according to the correlations, color complementation data for performing color complementation of the WOLED display device.

In some embodiments, the color complementation circuit is integrated with a screen driver board of a display component.

In some embodiments, the color complementation circuit is connected to the screen driver board of the display component.

In another aspect, the present disclosure also provides a display control device of a WOLED display device, including a processor; and a code memory configured to store computer readable codes, which when been executed by the processor, causing the processor to perform the color complementation method for the WOLED display device according to any one of the above-described.

In some embodiments, the display control device further includes a memory configured to store the correlations.

In some embodiments, the display control device is further configured to communicate with a driver of the WOLED display device to output the correlations to the driver.

It shall be understood that the above general descriptions and the following detailed descriptions are exemplary and explanatory only, and are not intended to be restrictive of the present disclosure.

This section provides an overview of various implementations or examples of the techniques described in present disclosure, and rather than a full disclosure of the full scope or all the features of the disclosed techniques.

BRIEF DESCRIPTION OF THE DRAWINGS

In order to more clearly describe the technical solutions in the embodiments of the present disclosure, the drawings used in the descriptions of the embodiments will be briefly described below. Obviously, the drawings in the following descriptions are only some embodiments of the present disclosure, and those skilled in the art can also obtain other drawings based on these drawings without any creative work.

DETAILED DESCRIPTION

In order to make objects, technical solutions and advantages of the present disclosure more clear, the present disclosure will be further described in detail with reference to the drawings and specific embodiments.

An embodiment of the present disclosure provides a color complementation method for a WOLED display device to improve a conventional color complementation method. A color complementation method for a WOLED display device generally includes: measuring chromaticity coordinates of R, B, and W sub-pixels under a certain brightness (the chromaticity coordinates of the R, B, and W sub-pixels may represent the chromaticity coordinate of the R sub-pixel, the chromaticity coordinate of the G sub-pixel, the chromaticity coordinate of the B sub-pixel, and the chromaticity coordinate of the W sub-pixel, i.e., the chromaticity coordinate of each of the four sub-pixels, it is apparent that the situation equally applies to same or similar expression forms below); calculating color complementation ratios of the R, B, and W sub-pixels according to a colorimetric color mixing formula; determining a W output brightness (an output brightness of the W sub-pixel); and then multiplying the W output brightness by the color complementation ratios of the R, B, and W sub-pixels to obtain color complementation brightnesses of the R, B, and W sub-pixels, and achieve color complementation of the WOLED display device. A problem for the above-mentioned color complementation method is that the color complementation is inaccurate, which affects display effect.

Figure 1:
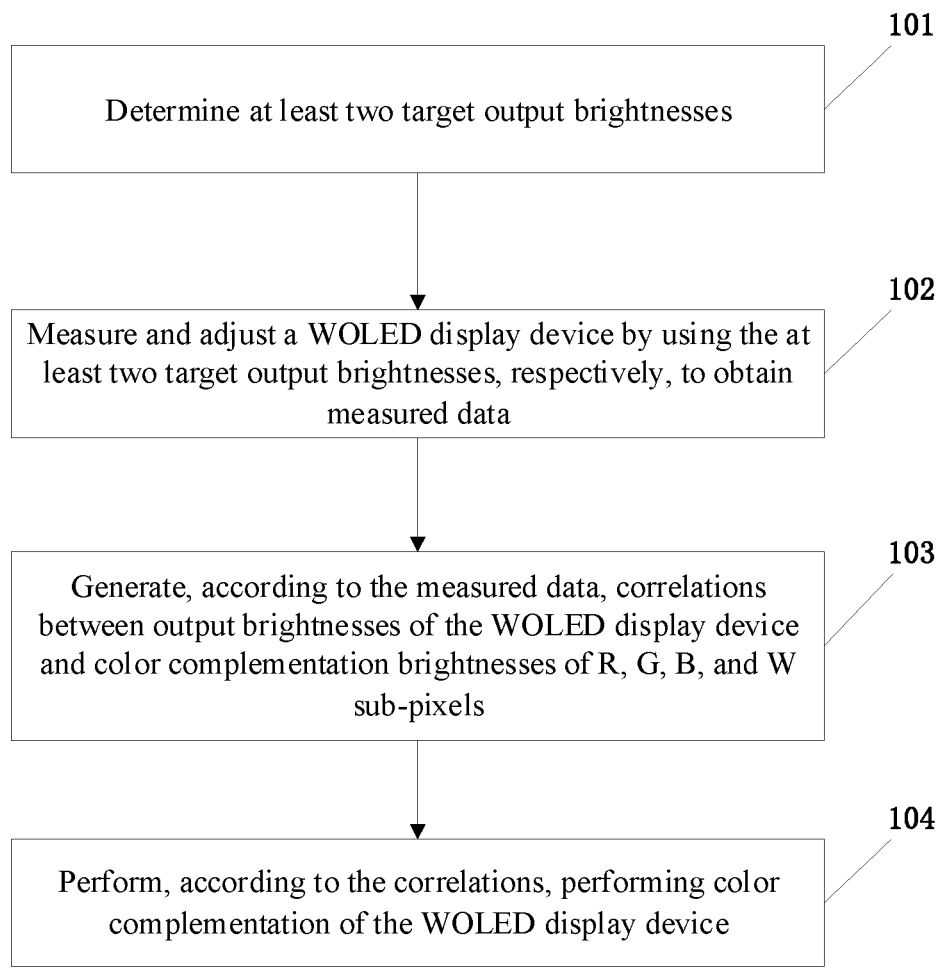
FIG. 1 is a flow chart showing a color complementation method for a WOLED display device according to an embodiment of the present disclosure.

FIG. 1 is a flow chart showing a color complementation method for a WOLED display device according to an embodiment of the present disclosure.

The color complementation method for the WOLED display device (for example, a WOLED display panel) includes the following steps:

In step 101, at least two target output brightnesses are determined.

In the step, the target output brightnesses are output brightnesses that the WOLED display device can achieve in practical work. In a subsequent step, in order to calculate and generate correlations between the output brightnesses of the WOLED display device and color complementation brightnesses of the R, B, and W sub-pixels by data to be used corresponding to the target output brightnesses, the number of target output brightnesses is at least two.

Alternatively, when the target output brightnesses are selected, at least two brightness values are continuously obtained as the target output brightnesses at a predetermined brightness interval. The use of at least two target output brightnesses at the same interval can facilitate the selection of data and improve accuracy in subsequent calculation and processing. It is obvious that when a smaller predetermined brightness interval is selected, correlations obtained by subsequent calculation and processing are more accurate, but corresponding data setting and calculation processing workload are larger. Therefore, based on the consideration of the data setting and calculation processing workload, in an optional embodiment, a setting range of the predetermined brightness interval is about 1-20 nit; wherein an optional value of the predetermined brightness interval is about 10 nits; and the total number of the determined target output brightnesses is 40. With the optional predetermined brightness interval and the number of the target output brightnesses being set, data processing amount will be moderate, a measured process can be conveniently and efficiently performed in the subsequent steps, and a calculation processing result will be highly accurate.

Obviously, in other embodiments, when the target output brightnesses are determined, according to actual needs for implementation, at least two target output brightnesses may be determined at unequal brightness intervals.

In step 102, the WOLED display device is measured and adjusted by using the at least two target output brightnesses, respectively, to obtain data to be used.

In this step, the measuring and adjusting specifically includes: allowing output brightnesses of the WOLED display device to be same as the target output brightness, and adjusting output brightnesses of the R, B, and W sub-pixels in such a manner that output chromaticity coordinates of the WOLED display device reach preset chromaticity coordinates, and the output brightnesses of the R, B, and W sub-pixels at that time are recorded as the color complementation brightnesses of the R, B, and W sub-pixels. The preset chromaticity coordinates are predetermined output chromaticity coordinates that can be actually achieved by the WOLED display device (in an ideal state, the preset chromaticity coordinates will not change along with the changing of the output brightnesses of the WOLED display device). Each of the determined target output brightnesses is measured and adjusted to record the color complementation brightnesses of the R, B, and W sub-pixels corresponding to each of the target output brightnesses.

Correspondingly, the data to be used includes the at least two target output brightnesses and the corresponding color complementation brightnesses of the R, B, and W sub-pixels.

In step 103, correlations between the output brightnesses of the WOLED display device and the color complementation brightnesses of the R, B, and W sub-pixels are generated according to the data to be used.

The data to be used, which is obtained in the foregoing step, includes at least two groups of paired data (correspondence between the target output brightnesses and the color complementation brightnesses of the R, B, and W sub-pixels), continuous correlations between two variables corresponding to the paired data are obtained based on the at least two groups of discontinuous paired data by employing a numerical processing method. In this step, based on the data to be used, the data to be used is calculated and processed by an interpolation method or a fitting method to obtain the correlations between the output brightnesses of the WOLED display device (corresponding to the target output brightnesses in the data to be used) and the color complementation brightnesses of the R, B, and W sub-pixels.

In step 104, color complementation of the WOLED display device is performed (namely, display control of the WOLED display device is performed) according to the correlations. For example, color complementation data for performing color complementation of the WOLED display device are obtained according to the correlations, and the color complementation data are used to perform the color complementation of the WOLED display device.

In this step, the correlations obtained in the foregoing step is applied to an actual display process of the WOLED display device, that is, the color complementation of the WOLED display device is performed based on the correlations. Specifically, the process of performing color complementation according to the correlations includes: determining an output brightness of the display device; determining, according to the correlations, color complementation brightnesses of the R, B, and W sub-pixels corresponding to the output brightness of the display device; adjusting output brightnesses of the R, B, and W sub-pixels as the color complementation brightnesses of the R, B, and W sub-pixels.

There is also a one-to-one correspondence relationship between the correlations and the WOLED display device because the correlations are calculated based on the data to be used of the WOLED display device. That is to say, a unique color complementation method is provided for each WOLED display device by the embodiments of the present disclosure. By using the color complementation method provided by the embodiments of the present disclosure to perform color complementation of the WOLED display device, it is apparent that the color complementation accuracy can be maximized, and the actual display effect of the WOLED display device can be effectively improved.

Figure 2:
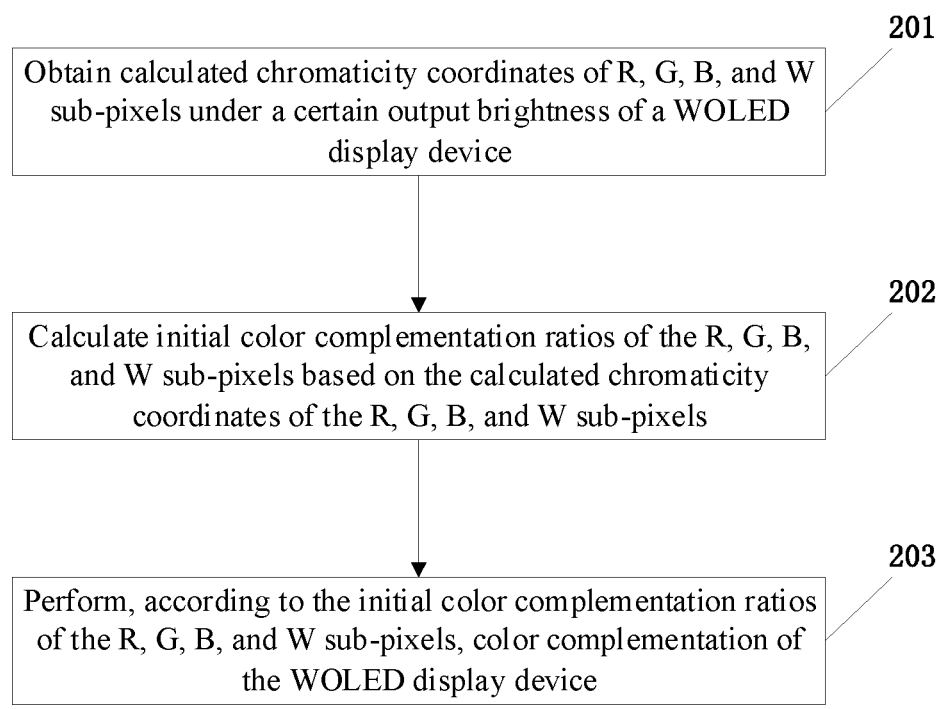
FIG. 2 is a flow chart showing initial color complementation steps according to an embodiment of the present disclosure.

In some optional embodiments, the color complementation method for the WOLED display device further includes: initial color complementation steps. FIG. 2 is a flow chart showing the initial color complementation steps in an embodiment of the present disclosure.

In the present embodiment, the initial color complementation steps are performed at first, that is, the initial color complementation step should be performed before the step 101 in the foregoing embodiment.

The initial color complementation steps include the following steps:

In step 201, calculated chromaticity coordinates of the R, B, and W sub-pixels under a certain output brightness of the WOLED display device are obtained.

In this step, the WOLED display device is powered on to perform a normal display process, and the WOLED display device is adjusted to a certain output brightness (the output brightness is set by a person skilled in the art based on experience), and then the output brightnesses of the R, B, and W sub-pixels at that time are recorded as the calculates chromaticity coordinates of the R, B, and W sub-pixels.

Alternatively, the following implementation manner is used for obtaining the calculated chromaticity coordinates of the R, B, and W sub-pixels: the WOLED display device is powered on to perform a normal display process, and then the output brightness of the WOLED display device is continuously increased. In the above process, the chromaticity coordinates of the R, B, and W sub-pixels will be significantly changed with the increase of the output brightness of the WOLED display device. Due to manufacturing processes of the WOLED display device, when the output brightness of the WOLED display device is increased to a certain value, the chromaticity coordinates of the R, B, and W sub-pixels will no longer be changed (or significantly changed) as the output brightness of the WOLED display device increases, at this time, the chromaticity coordinates of the R, B, and W sub-pixels are proximate to chromaticity coordinates displayed in actual work, so the chromaticity coordinates of the R, B, and W sub-pixels at that time are recorded as the calculated chromaticity coordinates of the R, B, and W sub-pixels, which can improve the accuracy of the color complementation ratios obtained in the initial color complementation steps in this embodiment.

In step 202, initial color complementation ratios of the R, B, and W sub-pixels are calculated based on the calculated chromaticity coordinates of the R, B, and W sub-pixels.

In this step, the initial color complementation ratios of the R, B, and W sub-pixels are calculated based on the calculated chromaticity coordinates of the R, B, and W sub-pixels obtained in the foregoing steps by the colorimetric color mixing formula. The detailed process of calculating the initial color complementation ratios of the R, B, and W sub-pixels in this step may refer to the related art, and the specific calculation process, principle, and formula will not be described in detail.

In step 203, color complementation of the WOLED display device is performed according to the initial color complementation ratios of the R, B, and W sub-pixels.

In this step, the initial color complementation ratios of the R, B, and W sub-pixels obtained in the foregoing step is applied to the actual display process of the WOLED display device. Specifically, the process of performing color complementation by using the initial color complementation ratios of the R, B, and W sub-pixels includes: determining a W output brightness of the display device, multiplying the W output brightness of the display device by the initial color complementation ratios of the R, B, and W sub-pixels to obtain initial color complementation brightnesses of the R, B, and W sub-pixels, and adjusting the output brightnesses of the R, B, and W sub-pixels as the initial color complementation brightnesses of the R, B, and W sub-pixels.

In this embodiment, the initial color complementation steps are first performed, that is, by using the foregoing color complementation method, a color complementation ratio of the R, B, and W sub-pixels is first determined and applied to the WOLED display device. Thus, the subsequent steps 101 to 104 are performed on the basis of a more accurate (it is "more accurate" than a WOLED display device without a color complementation mechanism) color complementation ratio, in this way, in the subsequent steps, the determined target output brightnesses the number of which is lesser may be selected, and the data processing amount in a subsequent calculation process is accordingly reduced, which can significantly improve the execution efficiency of the color complementation method in the present application.

Based on the same concept, an embodiment of the present disclosure further provides a display device in which the color complementation method for the WOLED display device according to any of the above embodiments is applied. The display device includes a color complementation module configured to perform color complementation of the WOLED display device according to the correlations. According to one embodiment of the present disclosure, the color complementation module may be formed by a corresponding color complementation circuit, for example, the color complementation module may be implemented using a correspondingly configured hardware circuit, the color complementation module will be described in more detail below.

In specific implementation, the color complementation module may be a component of TCON (screen driver board) in the WOLED display device, or may be a separate function module. Correspondingly, some embodiments of the present disclosure may provide a display device having the above-described color complementation module, and other embodiments may provide a color complementation device configured to perform color complementation of the display device, and the color complementation device may communicate with a driver of the display device to output a color complementation signal to the driver of the display device. In addition, the WOLED display device further includes: a color engine (chroma processor) configured to calculate the brightnesses and the chromaticity coordinates of the R, B, and W sub-pixels, perform the initial color complementation steps in the foregoing method embodiment, and output result information (the initial color complementation ratios of the R, B, and W sub-pixels) to a PG controller and a TCON controller; the PG controller (grayscale control module) configured to output grayscale values of R, G, and B sub-pixels according to the result information provided by the Color engine; and the TCON controller (screen driver board control module) configured to determine a display manner of RGB to RGBW according to the result information provided by the color engine.

When the color complementation module is used as the component of the TCON, the correlations are stored in a memory (storage unit) of the TCON, and the TCON reads the correlations in the Memory, and obtains the color complementation brightnesses of the R, B, and W sub-pixels corresponding to an output brightness of the current display device, and then work in cooperation with the PG controller and the TCON controller to perform color complementation display work. When operated as a separate module, the color complementation module has a memory to store the correlations, and the TCON reads the correlations in the color complementation module to obtain the color complementation brightnesses of the R, B, and W sub-pixels corresponding to an output brightness of the current display device, and then work in cooperation with the PG controller and the TCON controller to perform color complementation display work. In addition, when operated as a separate module, the color complementation module can have a processor and a code memory configured to store computer readable codes, when executed by the processor, causing the processor to perform the color complementation method for the WOLED display device according to the foregoing embodiments.

Obviously, the display device has the technical effect of high color complementation accuracy and good display effect because the color complementation method for the WOLED display device according to the foregoing embodiments is applied in the display device.

It should be understood by those of ordinary skill in the art that the discussion of any of the above embodiments is merely exemplary and is not intended to suggest that the scope of the present disclosure (including the claims) limited to the examples; the technical features in the above-described embodiments or different embodiments can be combined, and the steps can be carried out in any order, and there are many other variations in the various aspects of the present disclosure as described above, which are not provided in details for the sake of brevity.

In addition, well-known power source/ground connections to integrated circuit (IC) chips and other components may be or may not be shown in the accompanying drawings provided herein for simplicity of illustration and discussion, and in order not to obscure the present disclosure. Furthermore, the devices may be shown in the form of block diagram in order to avoid obscuring the present disclosure, and this also takes consideration of the fact that the details of the embodiments of the devices in block diagram are highly dependent on a platform for implementing the present disclosure (i.e., the details should be fully understood by those skilled in the art). In the case where the specific details (e.g., circuits) are set forth to describe the exemplary embodiments of the present disclosure, it will be apparent to those skilled in the art that the present disclosure can be implemented without providing such specific details or can be implement when such specific details changed. Accordingly, the descriptions are considered as illustrative rather than restrictive.

Although the present disclosure has been described in connection with the specific embodiments of the present invention, many alternatives, modifications and variations of these embodiments will be apparent to those skilled in the art. For example, the embodiments discussed may be used by other memory structures (e.g., dynamic RAM (DRAM)).

It can be seen from the above that the color complementation method for the WOLED display device and the WOLED display device are provided by the present disclosure, and the WOLED display device is tested in practice use, current output chromaticity coordinates are adjusted to preset chromaticity coordinates under different output metrics, respectively, at least two sets of data to be used are recorded, and complete correlations between color complementation brightness and an output brightness are obtained based on the data to be used, and then color complementation of the WOLED display device is performed, thereby improving color complementation accuracy and display effect.

The embodiments of the present disclosure are intended to cover all such alternatives, modifications, and variations which fall into the broad scope of the appended claims. Therefore, any omissions, amendments, equivalent replacements, improvements, etc., which are within the spirit and principle of the present disclosure shall fall into the scope of the present disclosure.

What is claimed is:

1. A display control method for a WOLED display panel, comprising:
    determining at least two target output brightnesses;
    measuring and adjusting the WOLED display device by using the at least two target output brightnesses, respectively, to obtain data to be used, wherein the step of measuring and adjusting the WOLED display device comprises: allowing an output brightness of the WOLED display device to be same as each of the target output brightnesses, and adjusting output brightnesses of R, G, B, and W sub-pixels in such a manner that an output chromaticity coordinate of the WOLED display device reach a preset chromaticity coordinate, and obtaining the output brightnesses of the R, G, B, and W sub-pixels at that time as color complementation brightnesses of the R, G, B, and W sub-pixels; and the data to be used comprises: the at least two target output brightnesses and the corresponding color complementation brightnesses of the R, G, B, and W sub-pixels;
    obtaining, according to the data to be used, correlations between the output brightnesses of the WOLED display device and the color complementation brightnesses of the R, G, B, and W sub-pixels;
    obtaining, according to the correlations, color complementation data for performing color complementation of the WOLED display device.

2. The method according to claim 1, further comprising:
    performing color complementation of the WOLED display device by using the color complementation data.

3. The method according to claim 1, further comprising:
    obtaining calculated chromaticity coordinates of the R, G, B, and W sub-pixels under a determined output brightness of the WOLED display device;
    calculating initial color complementation ratios of the R, G, B, and W sub-pixels based on the calculated chromaticity coordinates of the R, G, B, and W sub-pixels;
    obtaining, according to the initial color complementation ratios of the R, G, B, and W sub-pixels, the color complementation data for performing color complementation of the WOLED display device.

4. The method according to claim 3, wherein the step of obtaining, according to the initial color complementation ratios of the R, G, B, and W sub-pixels, the color complementation data for performing color complementation of the WOLED display device comprises:
    determining a W output brightness of the display device, multiplying the W output brightness of the display device by the initial color complementation ratios of the R, G, B, and W sub-pixels to obtain initial color complementation brightnesses of the R, G, B, and W sub-pixels, and adjusting the output brightnesses of the R, G, B, and W sub pixels as the initial color complementation brightnesses of the R, G, B, and W sub-pixels.

5. The method according to claim 1, wherein the step of obtaining, according to the correlations, color complementation data for performing color complementation of the WOLED display device comprises:
    determining the output brightness of the display device;
    determining, according to the correlations, the color complementation brightnesses of the R, G, B, and W sub-pixels corresponding to the output brightness of the display device;
    adjusting the output brightnesses of the R, G, B, and W sub-pixels as the color complementation brightnesses of the R, G, B, and W sub-pixels.

6. The method according to claim 1, wherein the step of determining at least two target output brightnesses comprises:
    continuously obtaining at least two brightness values as the target output brightnesses at a predetermined brightness interval.

7. The method according to claim 6, wherein the predetermined brightness interval ranges from about 1 nit to about 20 nits.

8. The method according to claim 7, wherein the predetermined brightness interval is about 10 nits.

9. The method according to claim 8, wherein the step of determining at least two target output brightnesses comprises:
    determining 40 target output brightnesses.

10. The method according to claim 3, further comprising:
    continuously increasing the output brightness of the WOLED display device;
    obtaining chromaticity coordinates of the R, G, B, and W sub-pixels; and
    obtaining the calculated chromaticity coordinates of the R, G, B, and W sub-pixels, when the chromaticity coordinates of the R, G, B, and W sub-pixels remain substantially unchanged along with the increasing of the output brightness of the WOLED display device.

11. A WOLED display device, in which the method according to claim 1 is applied, comprising: a color complementation circuit configured to obtain, according to the correlations, the color complementation data for performing color complementation of the WOLED display device.

12. The WOLED display device according to claim 11, wherein the color complementation circuit is integrated with a screen driver board of a display component.

13. The WOLED display device according to claim 11, wherein the color complementation circuit is connected to the screen driver board of the display component.

14. A display control device of a WOLED display device, comprising:
    a processor; and a code memory configured to store computer readable codes, which when been executed by the processor, causing the processor to perform the method according to claim 1.

15. The display control device according to claim 14, further comprising:
    a memory configured to store the correlations.

16. The display control device according to claim 14, further configured to communicate with a driver of the WOLED display device to output the correlations to the driver.

17. The method according to claim 2, wherein the step of obtaining, according to the correlations, color complementation data for performing color complementation of the WOLED display device comprises:
    determining the output brightness of the display device;
    determining, according to the correlations, the color complementation brightnesses of the R, G, B, and W sub-pixels corresponding to the output brightness of the display device;
    adjusting the output brightnesses of the R, G, B, and W sub-pixels as the color complementation brightnesses of the R, G, B, and W sub-pixels.

18. The method according to claim 3, wherein the step of obtaining, according to the correlations, color complementation data for performing color complementation of the WOLED display device comprises:

determining the output brightness of the display device;

determining, according to the correlations, the color complementation brightnesses of the R, G, B, and W sub-pixels corresponding to the output brightness of the display device;

adjusting the output brightnesses of the R, G, B, and W sub-pixels as the color complementation brightnesses of the R, G, B, and W sub-pixels.

19. The method according to claim 2, wherein the step of determining at least two target output brightnesses comprises:

continuously obtaining at least two brightness values as the target output brightnesses at a predetermined brightness interval.

20. The method according to claim 3, wherein the step of determining at least two target output brightnesses comprises:

continuously obtaining at least two brightness values as the target output brightnesses at a predetermined brightness interval.

\* \* \* \* \*